United States Patent
Kiriki

(10) Patent No.: US 8,471,576 B2
(45) Date of Patent: Jun. 25, 2013

(54) PROBE FOR A SOCKET, SOCKET FOR A SEMICONDUCTOR INTEGRATED CIRCUIT AND ELECTRONIC DEVICE

(75) Inventor: Nobuaki Kiriki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 478 days.

(21) Appl. No.: 12/776,805

(22) Filed: May 10, 2010

(65) Prior Publication Data

US 2010/0289515 A1    Nov. 18, 2010

(30) Foreign Application Priority Data

May 15, 2009    (JP) .................................. 2009-118248

(51) Int. Cl.
*G01R 31/20*    (2006.01)

(52) U.S. Cl.
USPC .................................................... 324/754.01

(58) Field of Classification Search
USPC .............. 324/754.01–754.3, 755.01–755.11, 324/762.01–762.1; 257/48; 438/14–18
See application file for complete search history.

(56) References Cited

U.S. PATENT DOCUMENTS

| 6,469,530 B1 * | 10/2002 | Johnson et al. .......... 324/750.25 |
| 7,535,241 B2 * | 5/2009 | Sinclair .................... 324/755.11 |
| 2007/0229103 A1 | 10/2007 | Tani |

FOREIGN PATENT DOCUMENTS

| JP | 60-8882 U | 1/1985 |
| JP | 2000-284020 A | 10/2000 |
| JP | 2003-297989 A | 10/2003 |
| JP | 2007-273233 A | 10/2007 |

* cited by examiner

*Primary Examiner* — Tung X Nguyen
(74) *Attorney, Agent, or Firm* — Fujitsu Patent Center

(57) ABSTRACT

A socket for electrically connecting conductive patterns of a circuit board and electrodes of an integrated circuit, the socket includes a main body, a plurality of hollow probes that connect conductive patterns of the circuit board and electrodes of the integrated circuit, the plurality of hollow probes provided to the main body, and an outlet that discharges a refrigerating medium passing through each of the hollow probes, the outlet provided on a side of the main body.

9 Claims, 5 Drawing Sheets

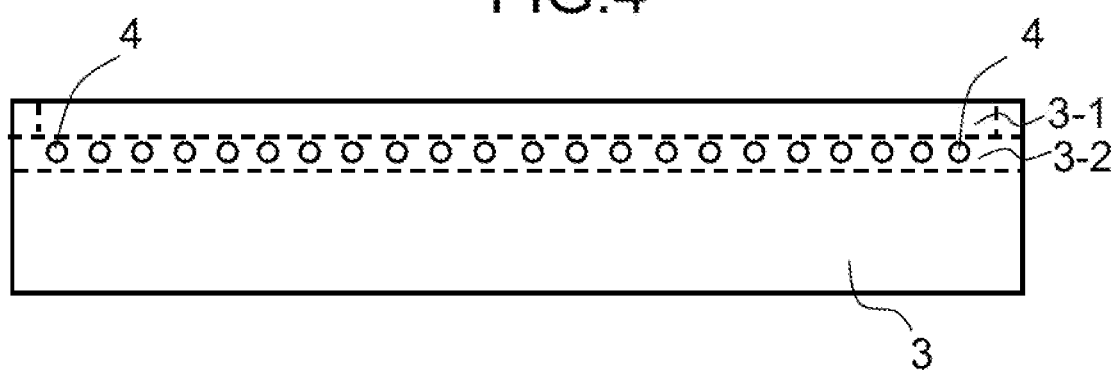

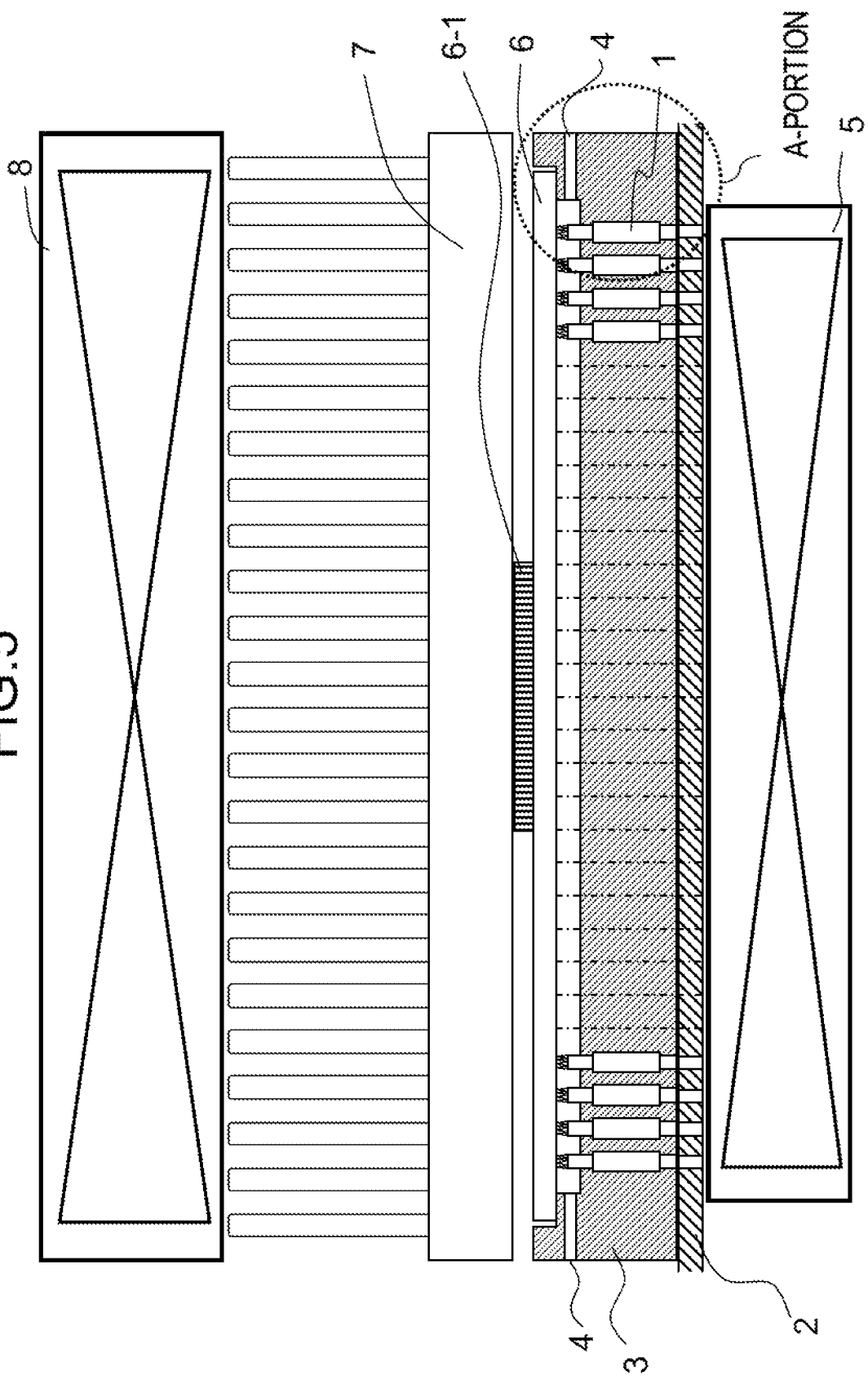

PROBE FOR A SOCKET, SOCKET FOR A SEMICONDUCTOR INTEGRATED CIRCUIT AND ELECTRONIC DEVICE

CROSS-REFERENCE TO RELATED APPLICATIONS

This application is based upon and claims the benefit of priority of the prior Japanese Patent Application No. 2009-118248, filed on May 15, 2009, the entire contents of which are incorporated herein by reference.

FIELD

The embodiments discussed herein are related to a probe for a socket, a socket for a semiconductor integrated circuit and an electronic device.

BACKGROUND

In order that an IC (Integrated Circuit) or LSI (Large Scale Integrated circuit) device is tested in a powered-on condition, such a device is mounted on a socket and is connected to a power supply or signal line. As a degree of integration of an IC chip forming the device increases and a clock rate increases in recent years, a current flowing through the device increases.

Thus, a temperature of the device remarkably increases while it is in operation. It is desired, particularly for a measuring test on such a device of significant heat generation to be run while cooling the device, to efficiently cool the IC device.

From such a viewpoint, a socket structured in such a way that a gap is provided between the socket having a probe and an IC device and that a cool stream flows from a side of the socket through the gap so as to cool the IC device has been proposed. Further, a socket structured in such a way that the socket is provided on a side portion with an aperture and that an air stream flowing from the socket side portion cools the socket and a probe has been proposed. There are Japanese Laid-open Patent Publication Nos. 2003-297989, 2000-284020, and 2007-273233 as reference documents.

As a current flowing through an IC device increases, an amount of heat generation not only of the IC device but also of a probe itself which provides the IC device with the current increases. If the amount of the heat generation of the probe increases, so do a resistance value of the probe and a loss of power caused by the probe. Thus, a quantity of a current allowed to flow through the IC device is limited.

Owing to an ordinary structure such that a socket itself or a probe itself is cooled from a side, the probe may be only partially cooled and the whole of the probe may not be effectively cooled. Thus, for an IC or LSI device of a large amount of power consumption, a loss caused by the resistance of the probe is significant, the resistance value of the probe increases owing to the heat generation of the probe, the quantity of the current allowed to flow is limited and it is difficult to test or run the device.

Further, upon letting a large quantity of a current flow from the probe to the IC or LSI device without paying an attention to the heat generation of the probe, the probe may possibly partially melt and spoil a function as the socket.

SUMMARY

According to an aspect of the embodiment, a socket for electrically connecting conductive patterns of a circuit board and electrodes of an integrated circuit, the socket includes a main body, a plurality of hollow probes that connect conductive patterns of the circuit board and electrodes of the integrated circuit, the plurality of hollow probes provided to the main body, and an outlet that discharges a refrigerating medium passing through each of the hollow probes, the outlet provided on a side of the main body.

According to another aspect of the embodiment, an electronic device includes an integrated circuit that includes electrodes, a circuit board that includes conductive patterns and a plurality of through holes, each of the conductive patterns provided around the corresponding through holes, a fan that sends a refrigerating medium, and a socket that electrically connects the conductive patterns of the circuit board and the electrodes of the integrated circuit, wherein the socket includes a main body, a plurality of hollow probes that connect the conductive patterns of the circuit board and the electrodes of the integrated circuit, the plurality of hollow probes provided to the main body, and an outlet that discharges a refrigerating medium passing through each of the hollow probes from the corresponding through holes, the outlet provided on a side of the main body.

According to another aspect of the embodiment, a probe for a socket electrically connecting a circuit board and an integrated circuit, the probe includes a main body that connects conductive patterns of the circuit board and electrodes of the integrated circuit, the main body being hollow and includes a portion shaped into peaks and notches in an upper portion being in contact with the integrated circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates a side view of the socket for an integrated circuit illustrated in FIGS. 1 and 2.

FIG. 5 illustrates a cross section of an electronic device of an embodiment.

DESCRIPTION OF EMBODIMENTS

Preferred embodiments of the present technique will be explained with reference to accompanying drawings. Examples of embodiments will be explained hereafter in order of embodiments of a socket for an integrated circuit, an electronic device and another embodiment. A probe for a socket, a socket for an integrated circuit and an electronic device which will be disclosed are not limited to the embodiments.

(Socket for Integrated Circuit)

Figure 1:
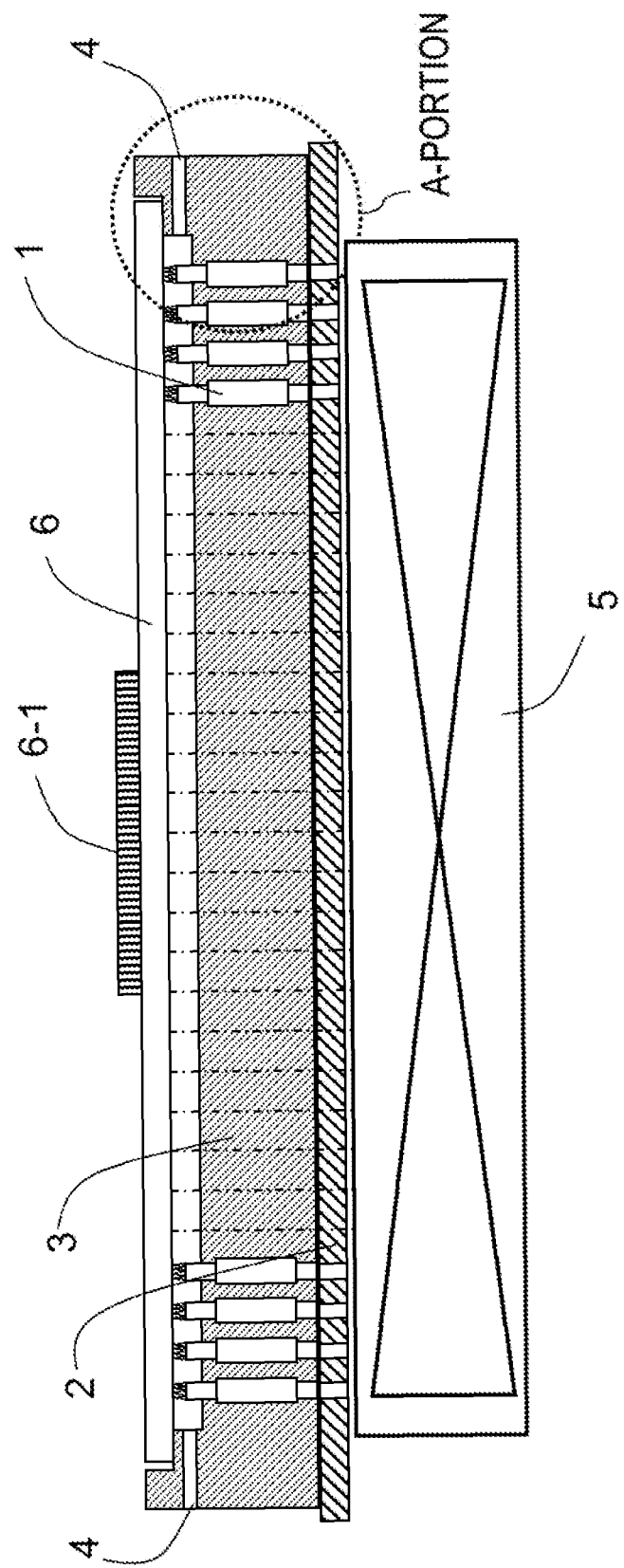
FIG. 1 illustrates a cross section of a structure of an embodiment of a socket for an integrated circuit.
Figure 2:
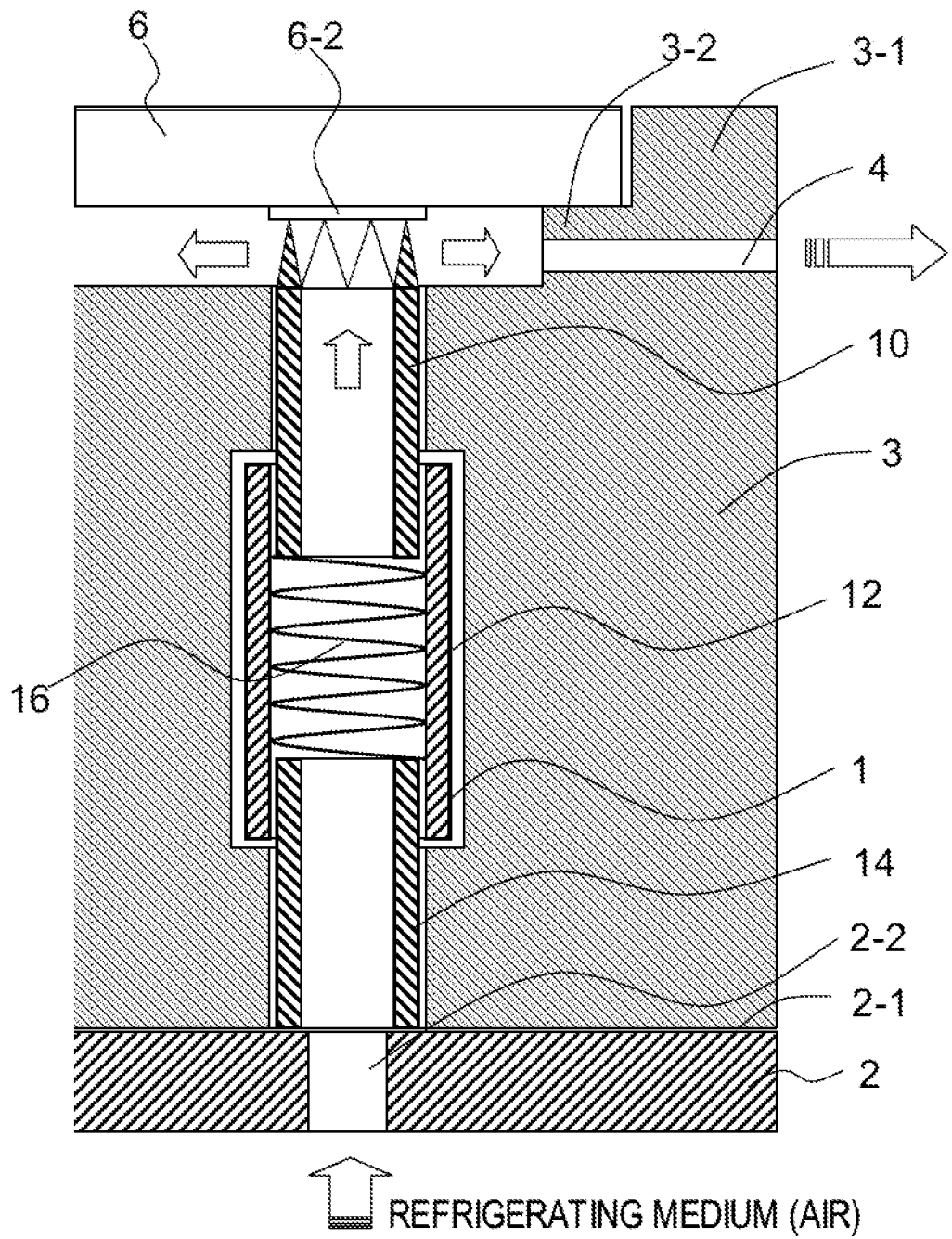
FIG. 2 illustrates a magnified drawing of an A-portion illustrated in FIG. 1.
Figure 3:
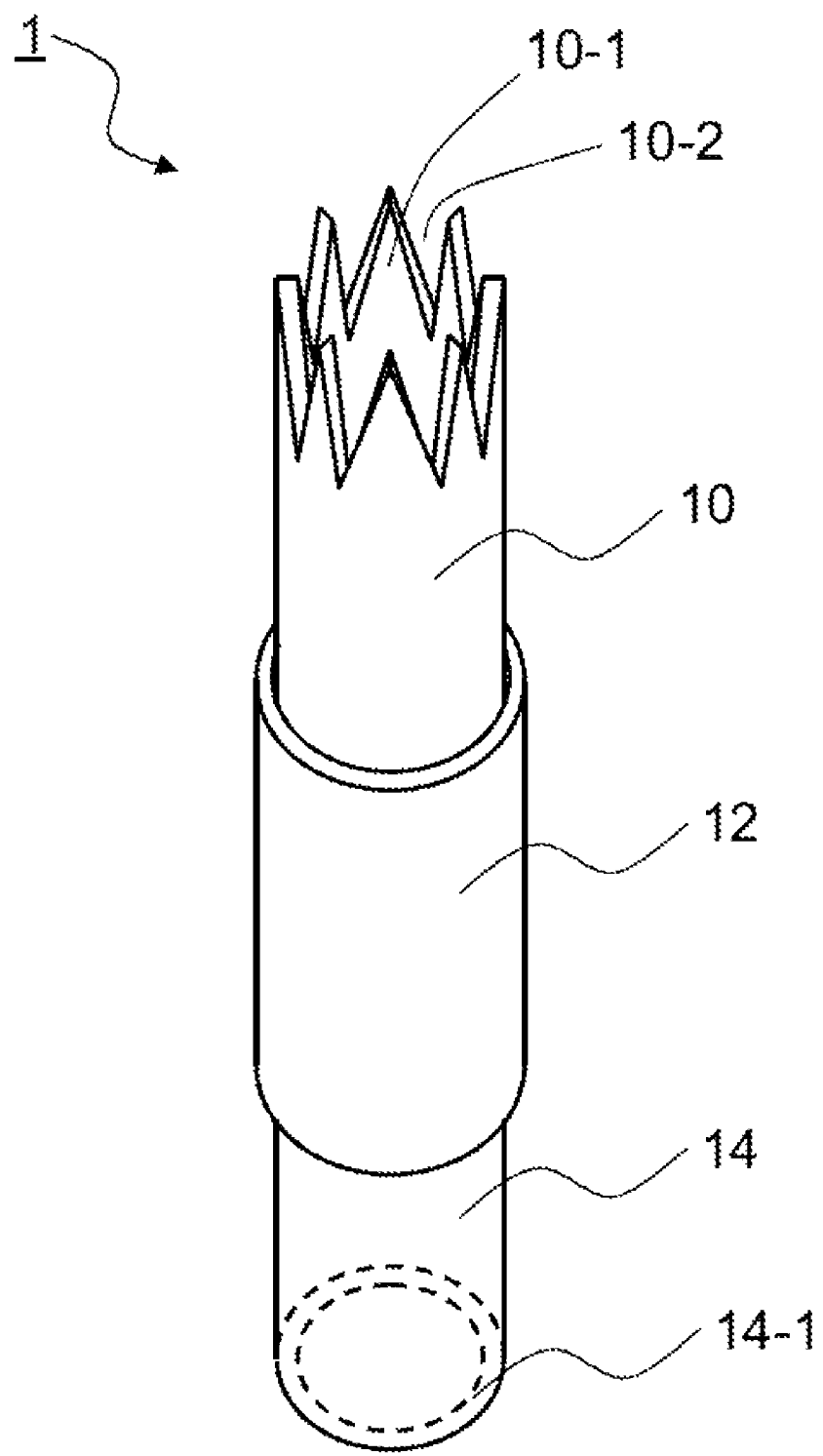
FIG. 3 illustrates a perspective view of a probe illustrated in FIGS. 1 and 2.

FIG. 1 illustrates a cross section of a structure of an embodiment of a socket for an integrated circuit of the disclosed technique. FIG. 2 illustrates a magnified drawing of an A-portion illustrated in FIG. 1. FIG. 3 illustrates a perspective view of a probe illustrated in FIGS. 1 and 2. FIG. 4 illustrates a side view of the socket for an integrated circuit illustrated in FIG. 1.

As illustrated in FIG. 1, a socket for an integrated circuit (called the socket hereafter) 3 supports an integrated circuit substrate 6 on which an integrated circuit package 6-1 including an integrated circuit chip is mounted. The socket 3 is provided on a printed board 2. The printed board 2 is provided on a back surface with a fan 5 which sends a refrigerating medium (air).

The socket 3 is provided with conductive probes 1 which electrically connect conductive patterns of the printed board 2 and electrodes (pins) of the integrated circuit substrate 6 separately as many as the electrodes (pins) of the integrated circuit substrate 6. Further, the socket 3 is provided on a side with refrigerating medium outlets 4.

As illustrated in the magnified drawing of FIG. 2, the probe 1 is structured to be hollow. Further, the probe 1 is constituted by an upper cylinder 10, a middle cylinder 12, a lower cylinder 14 and a coil spring 16. As illustrated in FIG. 3 as well, the lower cylinder 14 is provided on its lowest face with a contact face 14-1 being in contact with the pattern of the printed board 2 in a circular shape (or a doughnut shape). The lower cylinder 14 is structured to be hollow.

Further, peak and notch portions are shaped at a highest portion of the upper cylinder 10. A peak portion 10-1 shaped into a peak so as to be connected to an electrode (pin) 6-2 of the integrated circuit substrate 6. Further, a notch portion 10-2 is shaped into a notch so as to discharge the refrigerating medium which passes inside the probe 1 in a horizontal direction as described later. For the example illustrated in FIGS. 2 and 3, the peak and notch portions 10-1 and 10-2 are shaped, e.g., into triangles, and the highest portion of the upper cylinder 10 is provided with a plurality (eight in FIG. 3) of the peak and notch portions.

The upper cylinder 10 is also structured to be hollow. The middle cylinder 12 contains the coil spring 16, and covers a lower portion of the upper cylinder 10 and an upper portion of the lower cylinder 14. The coil spring 16 is provided between a lower face of the upper cylinder 10 and an upper face of the lower cylinder 14. The coil spring 16 electrically connects the upper cylinder 10 and the lower cylinder 14, and presses the upper cylinder 10 and the lower cylinder 14 upwards and downwards, respectively. Further, the middle cylinder 12 electrically connects the upper cylinder 10 and the lower cylinder 14 as well.

As illustrated in FIG. 2, the socket 3 has on an upper portion a first block 3-1 which supports the integrated circuit substrate 6 on the side and a second block 3-2 which gives a gap between the integrated circuit substrate 6 and the socket 3 and supports the integrated circuit substrate 6. The second block 3-2 is provided with the refrigerating medium outlet 4. As illustrated in the side view of FIG. 4, lots of the refrigerating medium outlets 4 are provided at positions where the probes 1 of the socket 3 are provided on the side of the socket 3.

As illustrated in FIG. 2, the hollow portion of the probe 1 of the socket 3 is positioned on a through hole 2-2 of the printed board 2, and the socket 3 is fitted to the printed board 2. The integrated circuit substrate 6 is put on the socket 3 in this state, and the integrated circuit chip is tested.

At this time, the contact face 14-1 is in contact with a pattern 2-1 of the printed board 2 on the lowest face of the lower cylinder 14 of the probe 1 provided to the socket 3. Further, the socket 3 supports the integrated circuit substrate 6 across the gap, and the upper cylinder 10 is in contact with an electrode 6-2 of the integrated circuit substrate 6 by means of the coil spring 16 of the probe 1. To put it exactly, the peak portion 10-1 of the upper cylinder 10 is in contact with the electrode 6-2 of the integrated circuit substrate 6.

Thus, the probe 1 electrically connects the pattern 2-1 of the printed board 2 and the electrode 6-2 of the integrated circuit substrate 6, and forms a refrigerating medium flow channel from the through hole 2-2 of the printed board 2 to the gap of the socket 3.

An operation of this structure will be explained. The ventilating fan 5 illustrated in FIG. 1 sends a refrigerating medium (air) to the back surface of the printed board 2. The refrigerating medium passes through the through hole 2-2 of the printed board 2 owing to pressure and flows into the probe 1. As the contact face 14-1 is shaped like a plane so as to prevent a leakage of the refrigerating medium, the refrigerating medium passes inside the probe 1 without a leakage. As passing inside the probe 1, the refrigerating medium removes heat from the probe 1 and cools the probe 1.

The heated refrigerating medium is discharged from the notch portion 10-2 of the upper cylinder 10 of the probe 1 in a direction towards the side. The refrigerating medium which flows out from the upper cylinder 10 of the probe 1 passes the gap under the integrated circuit substrate 6, and is discharged from the outlets 4 provided on a circumferential portion of the socket 3 to the outside. That is, the gap provided between the integrated circuit substrate 6 and the socket 3 forms a space in which the refrigerating medium moves, and the space is linked to the outside through the outlets 4.

As described above, the refrigerating medium removes the heat from the probe 1 as passing the middle of the probe 1, and the heated refrigerating medium may be discharged in the direction towards the side of the socket 3. Thus, the probe 1 may be directly cooled, and a resistance value of the probe 1 may be prevented from increasing owing to the heat generation of the probe 1. Thus, a value of a current which may flow in the integrated circuit may be increased.

If a socket provided with a probe is used, in particular, a portion being in contact with the pattern 2-1 of the printed board 2 and a portion being in contact with the electrode 6-2 of the integrated circuit substrate 6 generate lots of heat and tend to be highly resistive. According to the embodiment, however, as the refrigerating medium removes the heat from the probe 1 as passing the middle of the probe 1 and the heated refrigerating medium is discharged in the direction towards the side of the socket, the contact portions may be directly cooled and the resistance values may be directly prevented from increasing.

As the probe 1 is just made hollow, the embodiment may be implemented without a change of the socket in size (the number of pins). Further, as the heated refrigerating medium is discharged to the side of the socket, the heated refrigerating medium is not directly in contact with the integrated circuit package 6-1 and the integrated circuit package 6-1 may be prevented from being unnecessarily heated.

Moreover, as the probe 1 is provided with the peaks and notches of the upper cylinder 10, the electric connection and the discharge of the refrigerating medium may be enabled at the same time. Further, the coil spring 16 may assure the electric contact of the probe 1.

(Electronic Device)

FIG. 5 illustrates a cross section of an embodiment of an electronic device which uses the socket for a semiconductor integrated circuit of the disclosed technique.

As illustrated in FIG. 5, the socket for an integrated circuit (called the socket hereafter) 3 supports the integrated circuit substrate 6 on which the integrated circuit package 6-1 including an integrated circuit chip is mounted. The socket 3 is provided on the printed board 2. The printed board 2 is provided on the back surface with the fan 5 which sends the refrigerating medium (air).

As illustrated with reference to FIGS. 1-4, the socket 3 is provided with the probes 1 which electrically connect the conductive patterns of the printed board 2 and the electrodes (pins) of the integrated circuit substrate 6 separately as many as the electrodes (pins) of the integrated circuit substrate 6. Further, the socket 3 is provided on the side with the refrigerating medium outlets 4.

Further, a heat sink 7 is provided above the integrated circuit package 6-1, and a second cooling fan 8 is provided above the heat sink 7. The heat sink 7 is provided with lots of fins, and the second cooling fan 8 is provided so as to cool the fins.

Thus, the heat sink 7 being in contact with the integrated circuit package 6-1 radiates heat generated by the integrated circuit package 6-1, and is cooled by the second cooling fan 8.

Meanwhile, the refrigerating medium (air) sent by the ventilating fan 5 flows in the middle of the probe 1, passes inside of the probe 1, and removes heat from the probe 1 and cools the probe 1 as passing inside the probe 1. The heated refrigerating medium is discharged from the notch portion 10-2 of the peak and notch portions of the upper cylinder 10 of the probe 1 in the direction towards the side, passes the gap under the integrated circuit substrate 6, and is discharged from the outlets 4 provided on the circumferential portion of the socket 3 to the outside. As described above, the refrigerating medium removes the heat from the probe 1 as passing the middle of the probe 1, and the heated refrigerating medium may be discharged in the direction towards the side of the socket 3.

Thus, the integrated circuit package 6-1 is cooled and the probe 1 may be directly cooled, so that the resistance value of the probe 1 may be prevented from increasing owing to the heat generation of the probe 1. Hence, a value of a current which may flow in the integrated circuit may be increased, and a large scale integrated circuit (LSI) of high speed and significant power consumption may be steadily tested and operated. It is quite effective for an acceleration test as the LSI is operated at a high speed in high temperature condition. Further, a high speed processor and a power semiconductor of significant power consumption are preferable as this LSI.

Further, the ventilating fan 5 and the second fan may send air in opposite directions as well as in a same direction. If, e.g., the ventilating fan 5 and the second fan send air in the same direction, it is preferable as air flows in the same direction as a whole and the heated air goes up.

(Another Embodiment)

The peaks and notches of the probe 1 of the embodiment described above are shaped into triangles, and another shape such as a trapezoid or an arc may be employed. Further, as the shape of the outlet 4, a rectangle and so on may be employed as well as a circle. Further, the shape of the probe 1 may be a triangular or a rectangular cylinder, etc. as well as a circular cylinder.

According to the above structure, as the probe provided to the socket on which an integrated circuit is mounted is made hollow, the refrigerating medium removes heat from the probe as passing the middle of the probe, and the heated refrigerating medium may be discharged in the direction towards the side of the socket. Thus, the probe may be directly cooled, and a resistance value of the probe may be prevented from increasing owing to the heat generation of the probe. Thus, a value of a current which may flow in the integrated circuit may be increased.

The disclosed technique has been described above according to the embodiment. The disclosed technique may be variously modified within the scope of the present technique, and does not exclude the modifications from the disclosed technique.

All examples and conditional language recited herein are intended for pedagogical purposes to aid the reader in understanding the invention and the concepts contributed by the inventor to furthering the technique, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A socket for electrically connecting conductive patterns of a circuit board and electrodes of an integrated circuit, the socket comprising:
    a main body;
    a plurality of hollow probes that connect conductive patterns of the circuit board and electrodes of the integrated circuit, the plurality of hollow probes provided to the main body; and
    an outlet that discharges a refrigerating medium passing through each of the hollow probes, the outlet provided on a side of the main body.

2. The socket according to claim 1, wherein each of the hollow probes comprises an upper portion that is in contact with the integrated circuit with a portion shaped into peaks and notches.

3. The socket according to claim 1, wherein the main body comprises a side block that supports the integrated circuit so as to form a space between a surface of the main body and the integrated circuit, and the side block is provided with the outlet.

4. The socket according to claim 1, wherein each of the hollow probes comprises an upper portion including a peak portion that is in contact with an electrode of the integrated circuit and a notch portion that discharges the refrigerating medium from inside of the main body into air, and a lower portion including a plane surface that is in contact with the conductive pattern provided around a corresponding through hole of the circuit board.

5. The socket according to claim 1, wherein each of the hollow probes comprises an upper hollow portion including a peak portion which is in contact with an electrode of the integrated circuit and a notch portion that discharges the refrigerating medium from inside of the main body into air, and a lower hollow portion that is in contact with the conductive pattern provided around a corresponding through hole of the circuit board.

6. The socket according to claim 5, wherein each of the hollow probes comprises a conductive elastic member provided between the upper hollow portion and the lower hollow portion, and a middle hollow portion covered the conductive elastic member.

7. A probe for a socket electrically connecting a circuit board and an integrated circuit, the probe comprising:
    a main body that connects conductive patterns of the circuit board and electrodes of the integrated circuit, the main body being hollow and includes a portion shaped into peaks and notches in an upper portion being in contact with the integrated circuit, the main body comprises an upper portion including a peak portion that is in contact with an electrode of the integrated circuit and a notch portion that discharges the refrigerating medium from inside of the main body into air, and a lower portion including a plane surface that is in contact with the conductive pattern provided around a corresponding through hole of the circuit board.

8. The probe according to claim 7, wherein the main body comprises an upper hollow portion including a peak portion that is in contact with an electrode of the integrated circuit and a notch portion that discharges the refrigerating medium from inside of the main body into air, and a lower hollow portion that is in contact with the conductive pattern provided around a corresponding through hole of a circuit board.

9. The probe according to claim 8, the main body comprises a conductive elastic member provided between the upper hollow portion and the lower hollow portion, and a middle hollow portion covered the conductive elastic member.

* * * * *